(12) United States Patent
Nara et al.

(10) Patent No.: US 7,989,766 B2
(45) Date of Patent: Aug. 2, 2011

(54) SAMPLE INSPECTION APPARATUS

(75) Inventors: Yasuhiko Nara, Hitachinaka (JP); Tohru Ando, Tokyo (JP); Masahiro Sasajima, Hitachinaka (JP); Tsutomu Saito, Hitachinaka (JP); Tomoharu Obuki, Hitachinaka (JP); Isamu Sekihara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 297 days.

(21) Appl. No.: 12/416,914

(22) Filed: Apr. 1, 2009

(65) Prior Publication Data
US 2009/0250610 A1    Oct. 8, 2009

(30) Foreign Application Priority Data

Apr. 3, 2008   (JP) .................................. 2008-096699

(51) Int. Cl.
H01J 37/28    (2006.01)

(52) U.S. Cl. ....................................... 250/306; 250/310

(58) Field of Classification Search .................. 250/306, 250/307, 310; 324/158.1, 751
See application file for complete search history.

(56) References Cited

U.S. PATENT DOCUMENTS

| 6,970,004 B2 * | 11/2005 | Ishitani et al. ........... 324/754.21 |
| 7,388,365 B2 * | 6/2008 | Nokuo et al. ............ 324/750.14 |

FOREIGN PATENT DOCUMENTS

| JP | 2002-368049 A | 12/2002 |
| JP | 2003-86913 A | 3/2003 |
| JP | 2008-211111 A | 9/2008 |

* cited by examiner

*Primary Examiner* — Kiet T Nguyen
(74) *Attorney, Agent, or Firm* — Miles & Stockbridge P.C.

(57) ABSTRACT

A sample inspection apparatus in which a fault in a semiconductor sample can be measured and analyzed efficiently. A plurality of probes are brought into contact with the sample. The sample is irradiated with an electron beam while a current flowing through the probes is measured. Signals from at least two probes are supplied to an image processing unit so as to form an absorbed electron current image. A difference between images obtained in accordance with a temperature change of the sample is obtained. A faulty point is identified from the difference between the images.

17 Claims, 12 Drawing Sheets

FIG.3A $Dn(i,j) = w \times D1(i,j) + g \times D2(i,j)$

WHERE w,g : WEIGHTING CONSTANT
D1,D2 : DIFFERENT IMAGES
Dn : NEWLY GENERATED IMAGE
D(i,j) : PIXEL DATA IN i-TH ROW AND j-TH COLUMN OF EACH IMAGE

FIG.3B

IN CASE OF SIMPLE DIFFERENCE : w=1, g=−1

NEW IMAGE = IMAGE 1 − IMAGE 2

IN CASE OF A PLURALITY OF IMAGES :

$$Dn(i,j) = \Sigma w(k) \times D(k)(i,j)$$

WHERE k : k-TH IMAGE
w(k) : WEIGHTING CONSTANT OF k-TH IMAGE
D(k)(i,j) : PIXEL DATA IN i-TH ROW AND j-TH COLUMN OF k-TH IMAGE
Dn : NEWLY GENERATED IMAGE

IN CASE OF SIMPLE DIFFERENCE BETWEEN TWO IMAGES OBTAINED AT DIFFERENT TEMPERATURES: w(1)=1, w(2)=-1

NEW IMAGE = IMAGE (TEMPERATURE 1) − IMAGE (TEMPERATURE 2)

FIG.5
IN CASE OF IMAGE OBTAINED BY SIMPLE DIFFERENCE BETWEEN TWO IMAGES OBTAINED AT DIFFERENT TEMPERATURES :
IN CASE OF SAMPLE TEMPERATURE A°C :
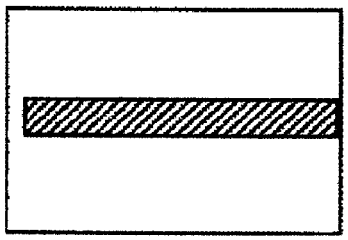
IN CASE OF SAMPLE TEMPERATURE B°C :
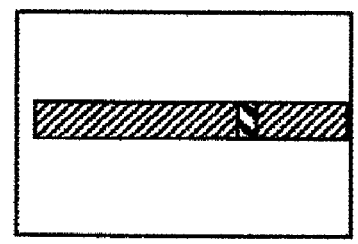
DIFFERENCE ↓

FIG.6
IN CASE OF IMAGE OBTAINED BY SIMPLE DIFFERENCE BETWEEN TWO
IMAGES OBTAINED IN DIFFERENT CONTACT POSITIONS OF PROBES :
IN CASE OF TWO PROBES
LOCATED ON ONE WIRE :
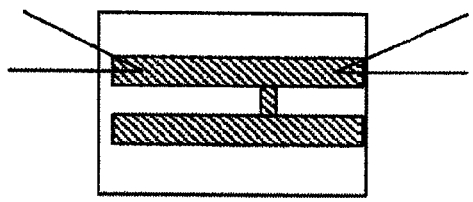
IN CASE OF TWO PROBES
LOCATED ON SHORT-CIRCUITED
WIRES RESPECTIVELY :
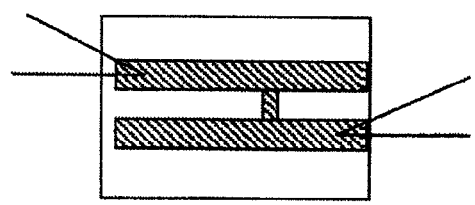
DIFFERENCE ↓
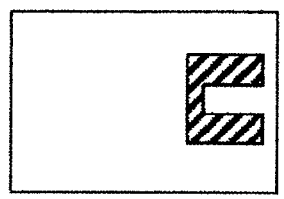

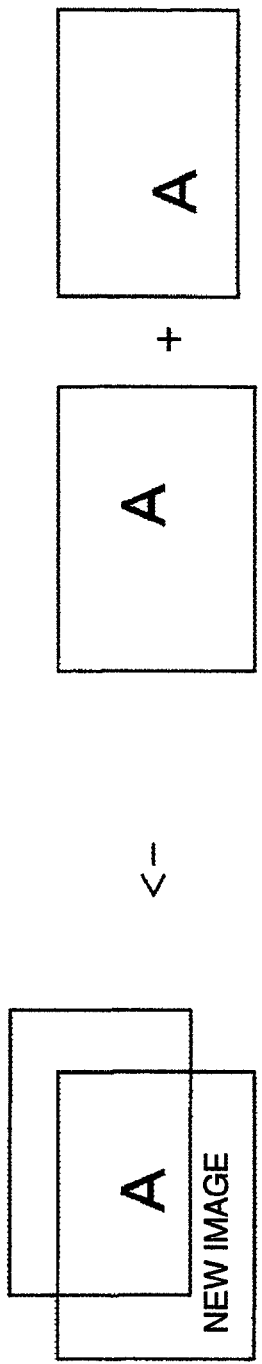

FIG.7A

IN CASE OF POSITION CORRECTION :

$$Dn(i,j) = \Sigma w(k) \times D(k)(i-pl(k), j-pc(k))$$

WHERE k : k-TH IMAGE
pl(k) : ROW-DIRECTION DISPLACEMENT OF k-TH IMAGE (REAL NUMBER)
pc(k) : COLUMN-DIRECTION DISPLACEMENT OF k-TH IMAGE (REAL NUMBER)
w(k) : WEIGHTING CONSTANT OF k-TH IMAGE
D(k)(i,j) : PIXEL DATA IN i-TH ROW AND j-TH COLUMN OF k-TH IMAGE
Dn : NEWLY GENERATED IMAGE

FIG.7B

IN CASE OF SIMPLE ADDITION OF TWO IMAGES OBTAINED AT DIFFERENT POSITIONS AND ALIGNED IN POSITION

IN CASE OF SECTION OBTAINED FROM TWO-DIMENSIONAL IMAGES SUPERIMPOSED ON ONE ANOTHER :

IN CASE OF FAULTY SITE IDENTIFIED FROM VERTICAL SECTION :
FIRST IMAGE  SECOND IMAGE  THIRD IMAGE  FOURTH IMAGE  FIFTH IMAGE

SECTION CUT OUT BY 3D SOFTWARE SECTION DISPLAYED
FAULTY POINT IDENTIFIED FROM DISPLAYED SECTION

SAMPLE INSPECTION APPARATUS

BACKGROUND OF THE INVENTION

The present invention relates to a sample inspection apparatus for analyzing a semiconductor sample or the like, and a method for producing an absorbed electron current image using the sample inspection apparatus. Particularly, it relates to a technique for specifying an electrically faulty point in wiring of a semiconductor sample or the like.

With development of finer devices, it has been difficult to specify a faulty point in a semiconductor sample having a circuit formed in the semiconductor surface, and it has taken enormous time to analyze the fault. For this reason, analyzers such as OBIRCH (Optical Beam Induced Resistance Change) or EB testers are used currently.

In the field of fault analysis in semiconductor samples, attention has been recently paid to wiring fault analyzing techniques in which the surface of a semiconductor sample is irradiated with an electron beam and a current absorbed from the wiring or a secondary signal emitted from the semiconductor sample is analyzed/imaged.

For example, a technique to bring probes into contact with the opposite ends or one side of a wiring pattern formed in a semiconductor sample, scan the wiring pattern on the semiconductor sample with an electron beam, and measure/image a current flowing through the probes to thereby specify a faulty point has been disclosed in JP-A-2002-368049.

A technique to amplify signals from a plurality of probes, obtain a differential signal between the signals, and scan the differential amplified signal to thereby display an image, and a technique to make a scan with a modulated electron beam for irradiation, and scan a signal similar to the aforementioned differential amplified signal to thereby display an image has been disclosed in JP-A-2003-86913.

SUMMARY OF THE INVENTION

As described in the aforementioned background-art techniques, an image generated from currents inputted through a plurality of probes shows a state of charged particles absorbed by a sample. Generally, a faulty point can be found by analyzing such an absorbed electron current image. However, when a resistance component of a faulty point is low or when wiring to be inspected is complicated, a difference in brightness between the faulty point and a normal point hardly appears so that it is difficult to identify the faulty point. Therefore, it is necessary to provide a method for facilitating identification of a faulty point.

When the optical conditions of charged particles are changed, absorbed electron current images different in a depth direction can be obtained. For example, if there is a disconnection in a depth direction, a signal from wiring will hardly appear in an absorbed electron current image obtained in a certain depth. It is difficult to find such a change even after many two-dimensional images are observed. In addition, such a state cannot be intuitively shown to a third party. Therefore, it is necessary to provide an image display method by which a fault in wiring or the like in a depth direction can be understood intuitively.

Further, when a probe is brought into contact with a sample, an electric discharge phenomenon may occur between the probe and the sample in the moment of the contact because the surface of the sample is charged or there is a potential difference between the probe and the sample surface. In such a case, the probe or the sample may be damaged. When charged particle images are obtained continuously for a long time, a similar phenomenon may occur. For this sake, it is necessary to electrically protect the sample and the probe.

A first object of the present invention is to provide an inspection apparatus in which absorbed electron current images detected by use of a plurality of probes are used to facilitate identification of a faulty point.

A second object of the present invention is to provide an inspection apparatus for displaying a faulty point in an image which is easier to observe.

A third object of the present invention is to protect a sample and probes when the probes are operated in the inspection apparatus.

It is generally believed that any faulty portion has some resistance value. When the temperature of a sample changes, it is more likely that the resistance value also changes. Accordingly, if an image obtained by a difference between absorbed electron current images (in another sense, absorbed electron voltage images) obtained during the change of the temperature is observed, a change of brightness appears conspicuously due to the change of resistance in the faulty portion. It is therefore possible to identify a faulty point easily.

Another image may be obtained as follows. That is, a plurality of images are obtained while the contact site of probes is changed. A weight is added to each image. An image is obtained by addition or subtraction of the weighted images. Alternatively, a plurality of images are obtained while electro-optical conditions are changed. A weight is added to each image. An image is obtained by addition or subtraction of the weighted images. In either image obtained thus, a change of brightness also appears conspicuously in a faulty portion. It is therefore possible to identify a faulty point easily.

Such a plurality of images obtained while the imaging conditions are changed may be displaced from one another. Therefore, position correction may be performed before the addition or subtraction of weighted images. Also in an image obtained thus, a change of brightness appears conspicuously in a faulty portion. It is therefore possible to identify a faulty point easily.

Further, a plurality of absorbed electron current images having information in a depth direction of a sample may be obtained while optical conditions of charged particles are changed. When the absorbed electron current images obtained thus are used for three-dimensional display, a sectional image in any position can be reconstructed. It is therefore possible to display a sectional image including a faulty point. In this manner, the faulty point can be displayed intuitively in the depth direction. In addition, the faulty point can be identified easily.

The surface of the sample may be charged, or there may be a potential difference between a probe and the sample surface. In such a case, an electric discharge phenomenon may occur between the probe and the sample at the moment of their contact. Thus, the probe or the sample may be damaged. A function is provided to automatically drop the optical conditions of the charged particles down to predetermined conditions when the probe is to be moved. For example, an acceleration voltage may be lowered. Alternatively, an emission current or a probe current may be lowered. In such a manner, the potential difference between the sample and the probe can be reduced so that the probe or the sample can be prevented from being damaged due to electric discharge or the like.

When a probe is to be moved, the probe may be electrically changed over to the ground level of the apparatus so as to restrain electric discharge or the like from occurring. Once the movement and the contact have been confirmed, electric connection of the probe is restored to its original connection, and the electro-optical conditions for irradiation of the sample with charged particles are also restored to their original conditions. When images are obtained continuously over a long time, a similar phenomenon may occur. When the optical conditions or the electric level of each probe is changed in the same manner, the sample and the probe can be protected electrically.

Further, the charge condition of the sample may be detected by a detector. The sample may be irradiated with an electron beam in electro-optical conditions by which the detected charge condition can be canceled. Alternatively, the potential level of each probe may be made as high as the charge condition of the sample. In such a manner, the probe is brought into contact with the sample in the state where electric discharge or the like hardly occurs. When the potential of the surface of the probe is dropped down to the ground level after the probe is brought into contact, charges accumulated in the surface can be relaxed.

According to the present invention, even a faulty point which has been difficult to identify from any absorbed electron current image can be identified easily by observing a change among images obtained during a temperature change of the sample or a change of optical conditions.

In addition, according to the present invention, a faulty site which has been difficult to identify in any two-dimensional image can be identified intuitively by reconstruction of an image cut out from a three-dimensional image.

Further, according to the present invention, electric discharge between the sample and each probe which may occur during movement of the probe can be suppressed.

Other objects, features and advantages of the invention will become apparent from the following description of the embodiments of the invention taken in conjunction with the accompanying drawings.

BRIEF DESCRIPTION OF THE DRAWINGS

FIGS. 3A and 3B are explanatory views of weighted addition and subtraction between two images, according to an embodiment of the present invention;

FIG. 5 is an explanatory view of weighted addition and subtraction between images obtained at different temperatures, according to an embodiment of the present invention;

FIG. 6 is an explanatory view of weighted addition and subtraction between images obtained in different probe contact positions, according to an embodiment of the present invention;

FIGS. 7A and 7B are explanatory views of weighted addition and subtraction between images having a displacement from each other, according to an embodiment of the present invention;

DESCRIPTION OF THE EMBODIMENTS

Embodiments of the present invention will be described below with reference to the accompanying drawings.

First Embodiment

Figure 1:
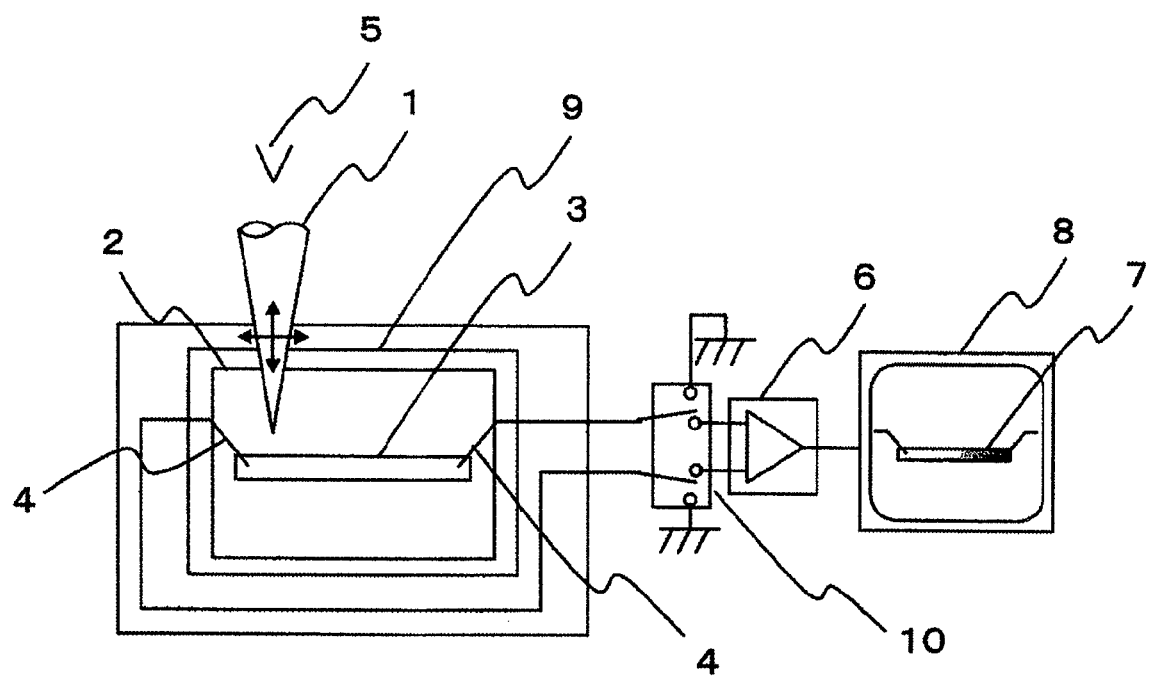
FIG. 1 is a schematic configuration diagram of a sample inspection apparatus according to an embodiment of the present invention.

FIG. 1 is a schematic configuration diagram of a sample inspection apparatus to which an embodiment of the present invention is applied.

A sample 2 is irradiated with a primary electron beam 1. There is a wiring pattern 3 in the surface of the sample 2. Probes 4 are brought into contact with one side or opposite ends of the wiring pattern 3 or a pad thereof. In this state, the surface of the sample 2 including the wiring pattern 3 is scanned with the primary electron beam 1 by an electron beam source 5.

Of the radiated primary electron beam 1, electrons flowing into the wiring pattern 3 are detected as a current by the probes 4. The detected current is inputted to an amplifier 6 so as to be amplified by the amplifier 6. The amplifier 6 generates and outputs a signal in accordance with the inputted signal. The outputted signal is synchronized with the scan with the primary electron beam 1 and displayed on a display portion 8 as an absorbed electron current image 7.

The sample 2 is heated/cooled by a sample heating/cooling portion 9 located under the sample 2. A plurality of absorbed electron current images 7 are obtained during the heating/cooling of the sample 2. Weighted addition/subtraction is performed on the absorbed electron current images 7 so that the position of a faulty point can be emphasized and identified. The weighted addition/subtraction of the images is performed after the position of each image is corrected and the magnification of each image is corrected. Although the present invention is described in a system which can be implemented by either way of heating and cooling, the present invention is not limited to the system but can be also applied to a system which can be implemented by only one of heating and cooling.

Figure 2:
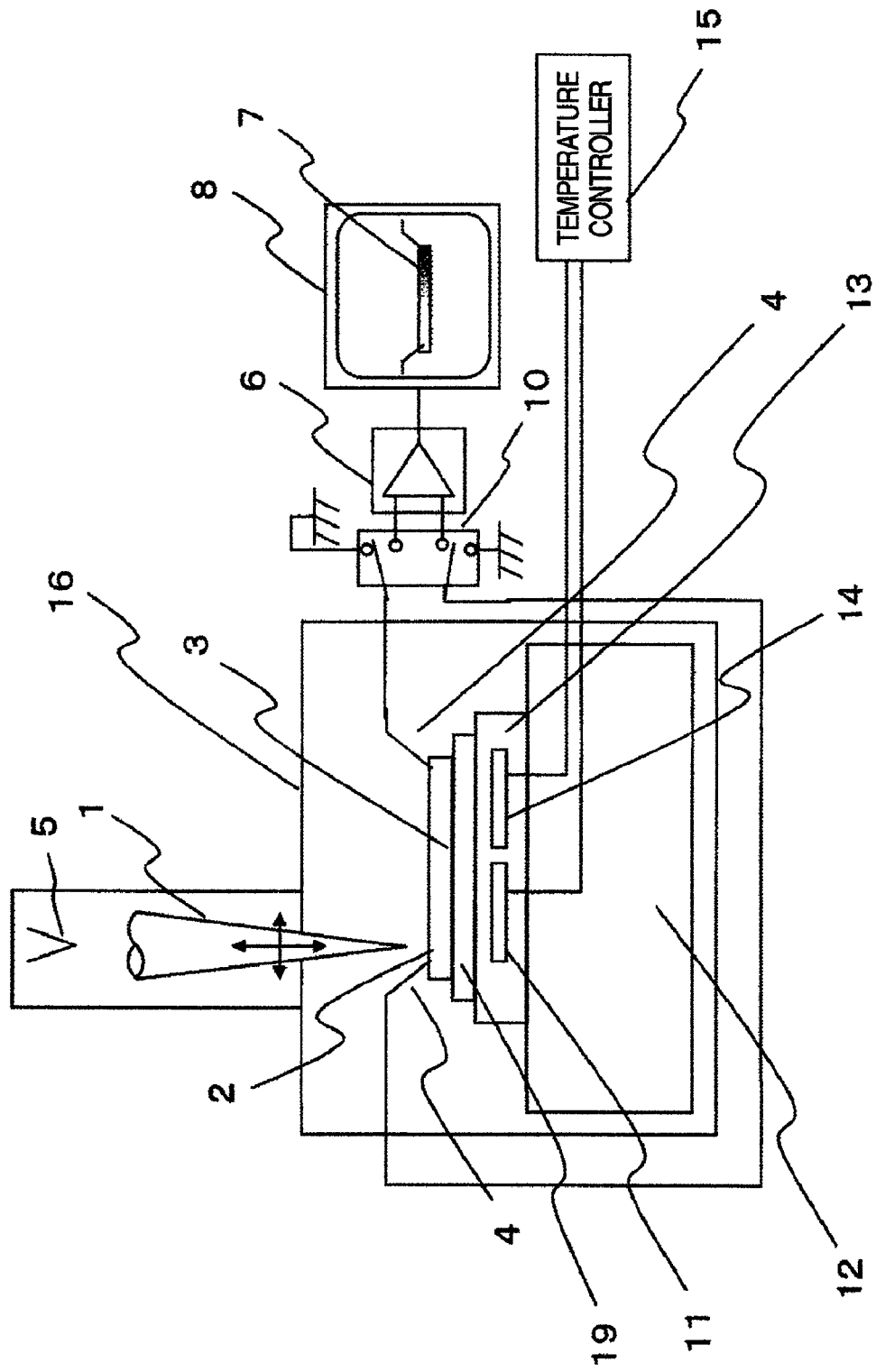
FIG. 2 is a schematic sectional view of a sample inspection apparatus according to an embodiment of the present invention.

FIG. 2 shows the inside of a vacuum chamber 16 sectionally. A sample holder 19 for holding a sample 2 is provided under the sample 2. A heater 11 for heating the sample 2 and a temperature sensor 14 for detecting the temperature of the sample 2 are built in a sample holder receiving portion 13 located under the sample holder 19. The temperature sensor and the heater are controlled by a temperature controller 15 so that the temperature of the sample 2 can be kept constant. A plurality of absorbed electron current images 7 are obtained when the system is used to change the temperature of the sample 2. By weighted addition/subtraction of the obtained images, the site of a faulty portion can be emphasized conspicuously.

If coloring is changed in accordance with numerical values of the weighted images, the faulty portion can be emphasized more clearly.

Second Embodiment

FIGS. 3A and 3B show expressions of weighted addition and subtraction of two absorbed electron current images. Two absorbed electron current images are added/subtracted with weighting constants w and g. The two images may be images obtained with the temperature being changed. Alternatively, the two images may be absorbed electron current images obtained with the electro-optical conditions being changed, or absorbed electron current images obtained with the contact positions of the probes being changed.

Figures 4A, 4B:
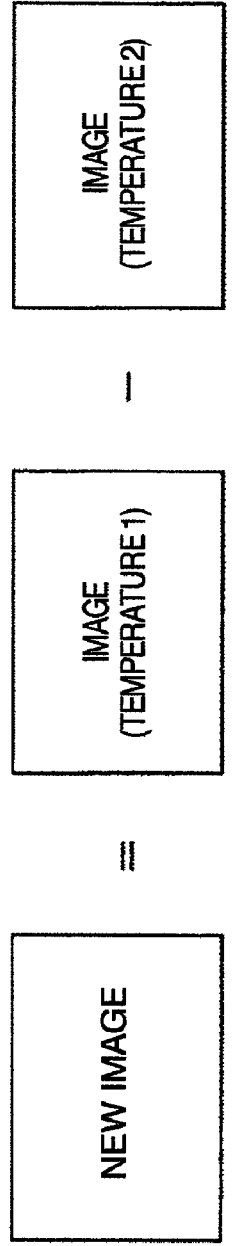
FIGS. 4A and 4B are explanatory views of weighted addition and subtraction among a plurality of images, according to an embodiment of the present invention.

FIGS. 4A and 4B show expressions in the case where the number of images in weighted addition and subtraction is increased to three or more while it is 2 in FIGS. 3A and 3B. FIGS. 4A and 4B show examples of images obtained in different temperatures when K=2.

Third Embodiment

FIG. 5 shows an explanatory example of a simple difference between two images obtained in different sample temperatures. Based on the obtained differential image, only a portion whose contrast has changed in accordance with the temperature change is emphasized.

Here, weighting coefficients may be determined so that pixel values in one and the same position in an image at a sample temperature A° C. and an image at a sample temperature B° C. can be equalized to each other.

Even if the position corresponds to a faulty position, pixel values in the other site than the faulty position will remain in an image obtained by weighted difference. Consequently, the faulty position will be emphasized.

FIG. 6 shows an example where in order to identify a short-circuit point in parallel wires, probes are brought into contact therewith at a plurality of points so as to obtain a plurality of absorbed electron current images concurrently, and weighted subtraction is performed on the plurality of absorbed electron current images so that the contrast of the short-circuit point can be emphasized.

Absorbed electron current images may be obtained not by a change of the temperature but by a change of electro-optical conditions. Also by weighted addition or subtraction of the absorbed electron current images obtained thus, a faulty point can be emphasized in the same manner.

Fourth Embodiment

As shown in FIGS. 7A and 7B, when images are obtained in two different conditions, the center positions of the images may be displaced or the magnifications of the images may be varied so that addition or subtraction cannot be used simply. In such a case, for example, by use of a least square method, a phase-only correlation method or the like, the displacement between the images is calculated, and weighted addition or subtraction is performed upon pixel values shifted by the calculated displacement. When the displacement is a real number, addition or subtraction is performed with proportional division being applied to fractions below decimal point. The magnifications may be adjusted by comparison in a characteristic part shared by the images.

Fifth Embodiment

Figure 8:
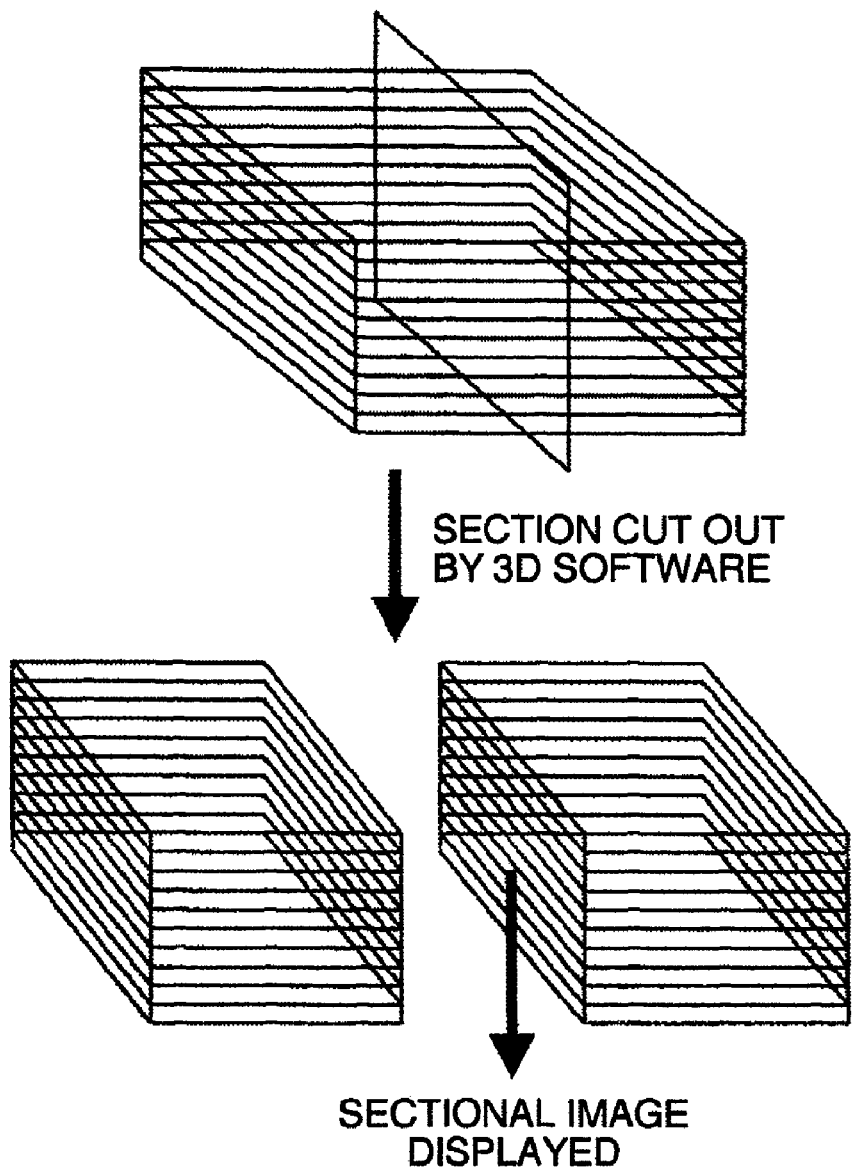
FIG. 8 is an explanatory view of cutting out of a section by 3D software, according to an embodiment of the present invention.

Absorbed electron current images obtained while changing the electro-optical conditions, for example, an acceleration voltage, will have information of depth from the sample surface. FIG. 8 shows the process of superimposing images obtained while changing an acceleration voltage and a current amount, and obtaining a desired sectional image by use of 3D-cut software.

Pixel data of a desired section is obtained by proportional interpolation calculation applied to data of each pixel of two-dimensional images close to the section.

Based on the section cut out thus, a fault of wiring which could not have been observed in a vertical direction can be confirmed by a two-dimensional image in the vertical direction. Thus, the time required for identifying the fault in the depth direction can be shortened.

Figure 9A:
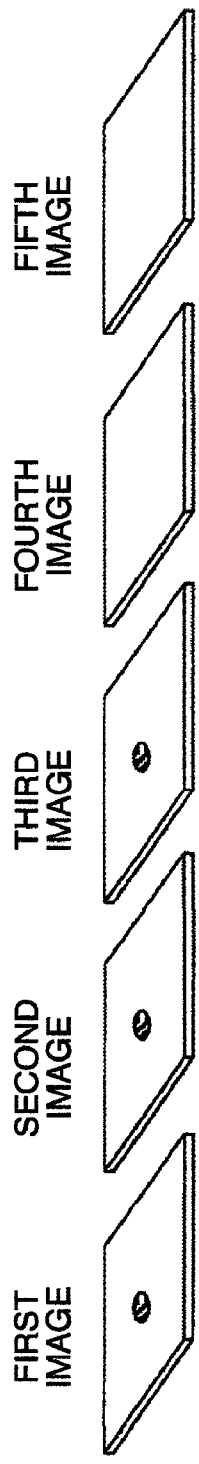
FIGS. 9A and 9B are explanatory views of identification of a faulty position in a section cut out by 3D software, according to an embodiment of the present invention.
Figure 9B:
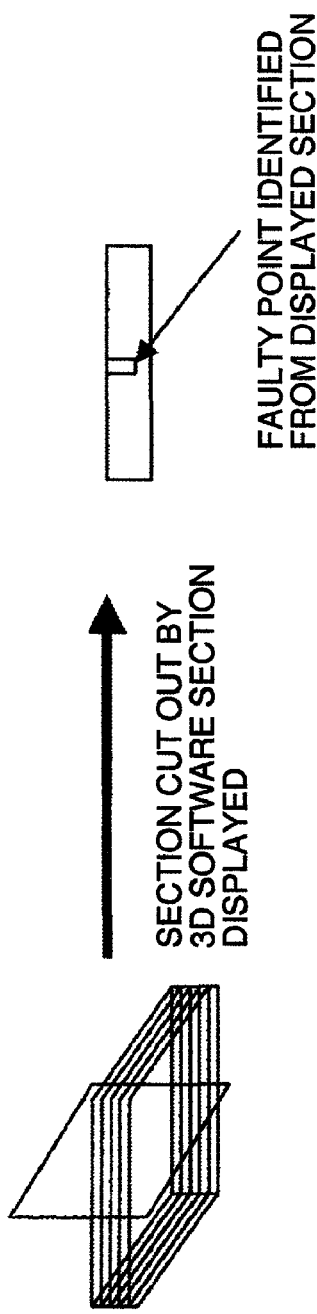

FIGS. 9A and 9B show an example where five images obtained in different electro-optical conditions are superimposed, only wires in the three images from top can be recognized on a horizontal image but some wire in the fourth or fifth image seems to be broken. When a section of the five images superimposed on one another is cut out as a sectional image by 3D image processing, the vertical position where the wire is broken can be confirmed by only one image.

Also in this case, when a 3D image is formed after displacements among the images are corrected in the same manner as in the fourth embodiment, the faulty position can be identified precisely.

Sixth Embodiment

The sample surface may be charged or there may be a potential difference between a probe and the sample surface. In such a case, when the probe is brought into contact with the sample surface, an electric discharge phenomenon may occur between the probe and the sample surface. Thus, the probe or the sample may be damaged. Therefore, a function is provided to drop the optical conditions of charged particles down to certain conditions automatically when the probe is to be moved.

Figure 10:
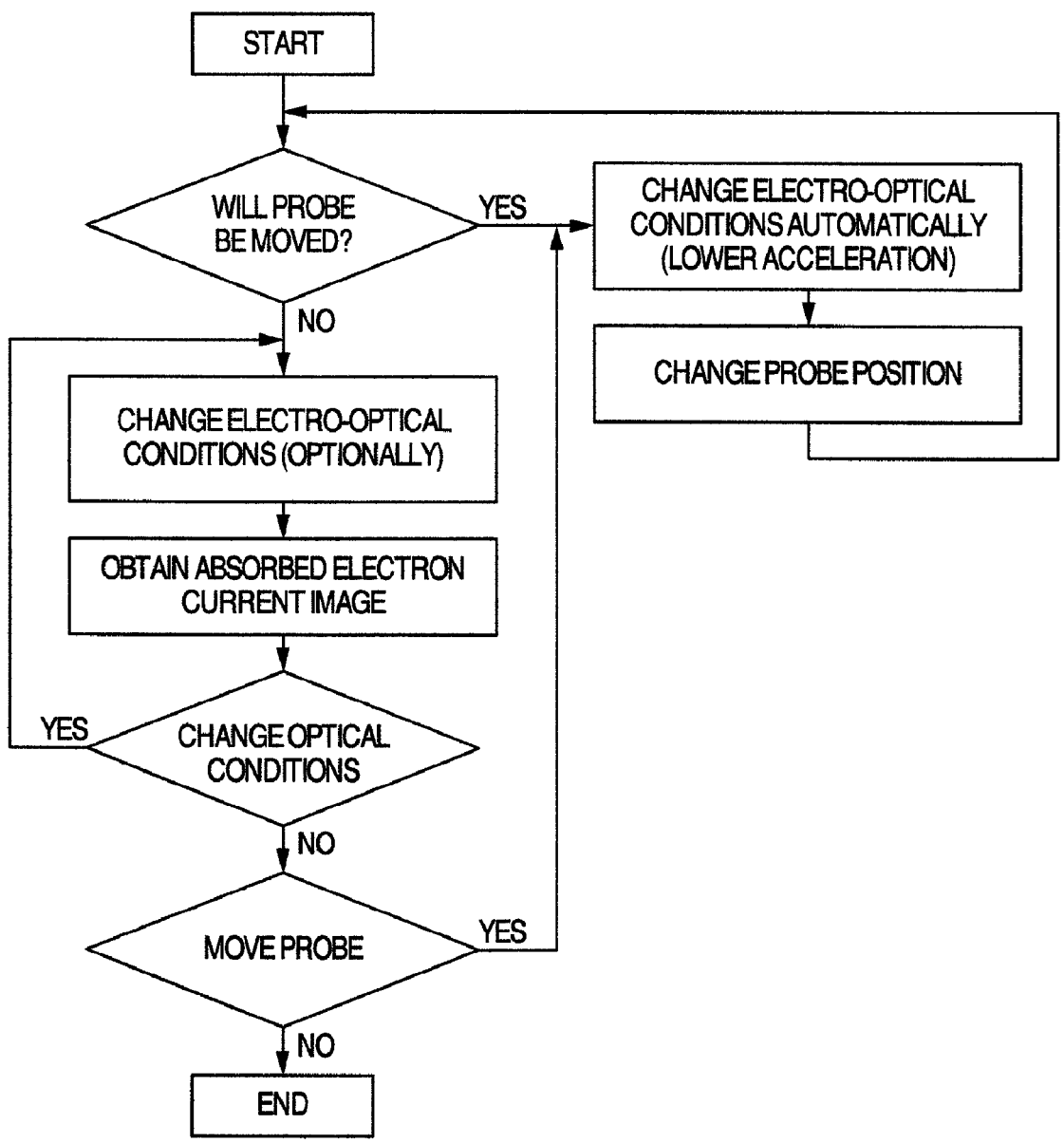
FIG. 10 is an explanatory view of a flow chart in which electro-optical conditions are changed when the position of a probe is to be changed, according to an embodiment of the present invention.

FIG. 10 shows an example of an operation flow chart for movement of a probe. A function is provided to change the optical conditions of charged particles down to certain conditions automatically when the probe is to be moved. For example, the conditions are changed to lower the acceleration voltage and also lower the emission current or the probe current. In such a manner, the potential difference between the sample and the probe can be reduced so that the probe or the sample can be prevented from being damaged due to electric discharge or the like.

After that, the probe is moved. Once the movement of the probe has been completed, the electro-optical conditions are restored to their original conditions used immediately before the movement. That is, the acceleration voltage is increased and the irradiation current is increased.

In this state, an absorbed electron current image is obtained. When the conditions are to be changed, another absorbed electron current image is obtained in new changed optical conditions.

Seventh Embodiment

Figure 11:
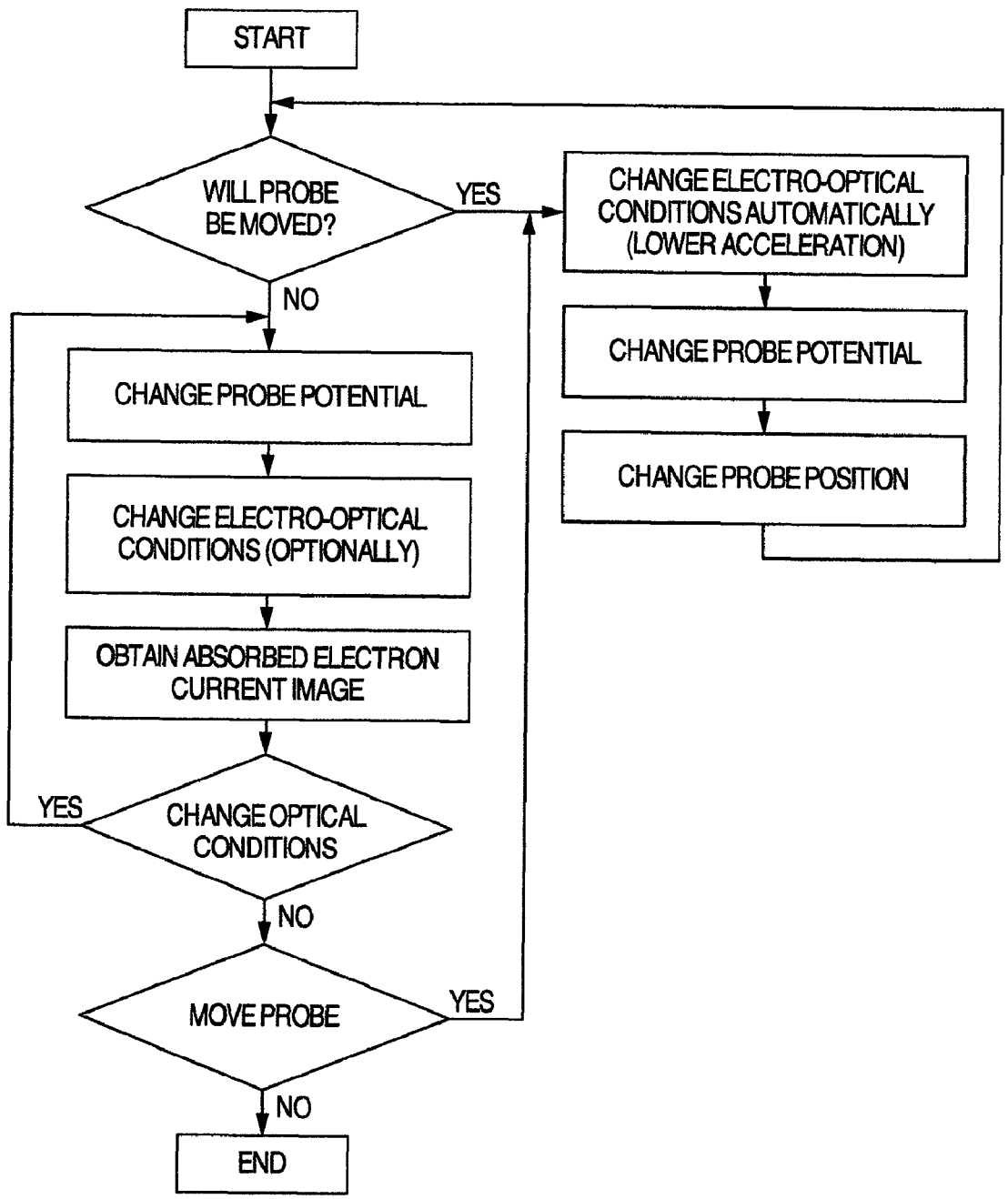
FIG. 11 is an explanatory view of a flow chart in which when the position of a probe is to be changed, electro-optical conditions are changed and the potential of the probe is also changed automatically, according to an embodiment of the present invention.

FIG. 11 shows a flow chart in which the potential of the probe is changed in addition to the electro-optical conditions changed in FIG. 10 to thereby prevent an electric discharge phenomenon when a probe is to be moved.

The flow chart will be described with reference to FIG. 2 by way of example. After the electro-optical conditions are changed, a switch of a signal changeover portion 10 is turned so as to connect a probe not to an amplifier to which the probe has been connected till then but to a ground terminal. Since the potential of the probe is changed to the ground level, the probe can be brought into contact with the surface of the sample more safely.

Once the movement of the probe has been completed, the probe is changed over from the ground connection to the amplifier connection, and the electro-optical conditions are restored automatically to their original conditions. After that, the flow goes to the step of obtaining an absorbed electron current image.

Eighth Embodiment

Figure 12:
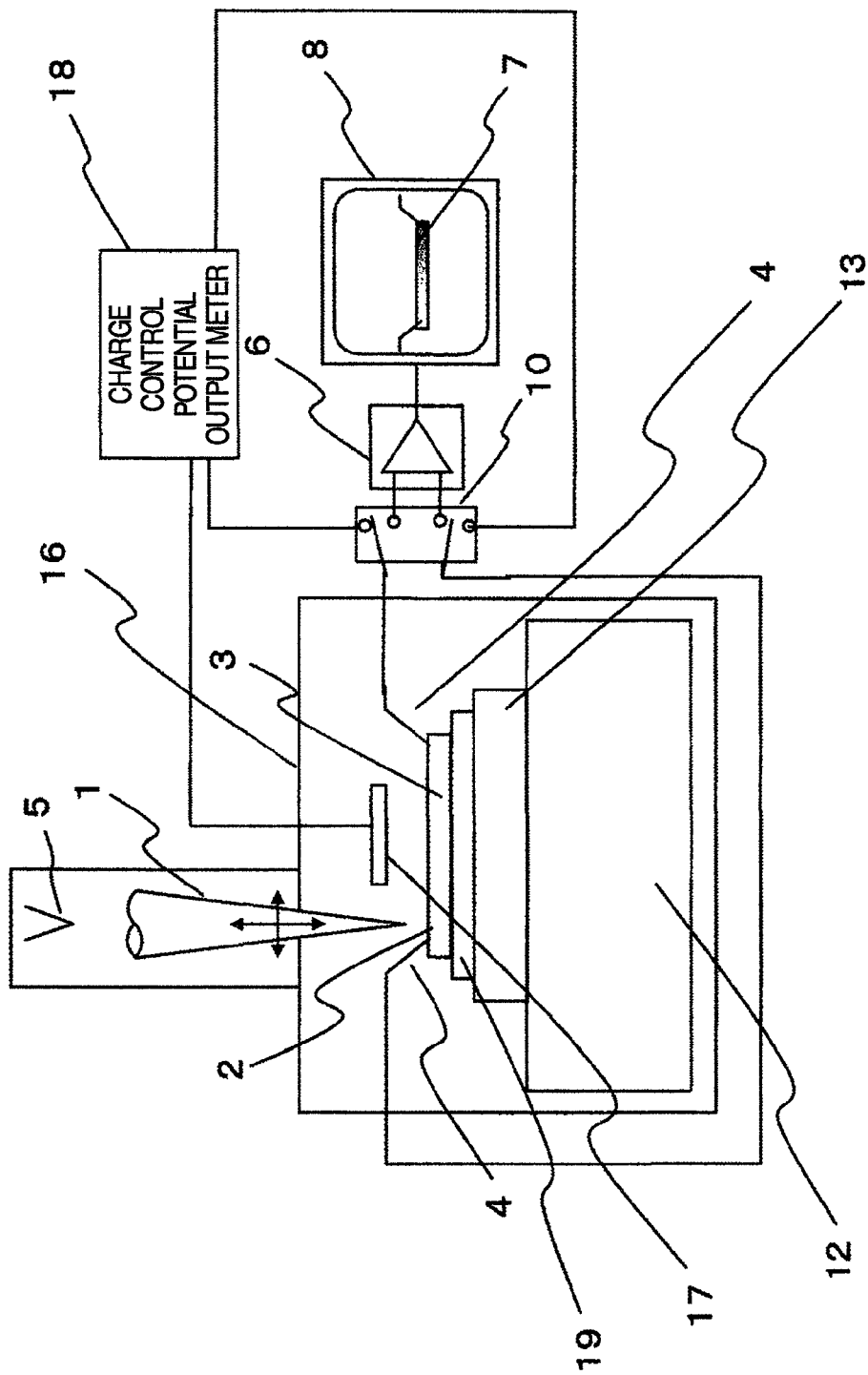
FIG. 12 is a schematic configuration diagram of a sample inspection apparatus in which when the position of a probe is to be changed, electro-optical conditions are changed and the potential of the probe is also changed automatically, according to an embodiment of the present invention.

A case where the change of the probe potential has been advanced will be described with reference to a flow chart of FIG. 12 using the same flow chart as FIG. 11. FIG. 12 shows a configuration further including a charge detector 17 for measuring the potential of the surface of the sample 2. The charge detector is, for example, a meter using capacitance.

When a probe is to be moved, the electro-optical conditions are changed automatically to lower ones with respect to the sample in the same manner as in the seventh embodiment. After that, the surface potential of the sample is measured by the charge detector 17, and control is made so as to equalize the potential output of a charge control potential output meter 18 to the measured potential.

The signal changeover portion 10 is changed over from the amplifier connection to the charge control potential output meter connection, and the potential of the probe is changed. The probe is moved and brought into contact with the sample. Since the potential of the probe is equal to the potential of the sample, electric discharge can be prevented. When the contact can be confirmed, the output of the charge control potential output meter 18 is dropped down to the ground level. As a result, the potential of the sample can be dropped down to the ground level. If an electric difference does not occur between the probe and the sample, the probe or the sample can be prevented from being damaged due to electric discharge or the like.

When the output of the charge control potential output meter 18 is changed to a desired voltage level, the potential condition of a wiring portion changes so that the emission of secondary electrons changes. Thus, the image contrast of a faulty portion changes so that the fault can be analyzed efficiently.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A sample inspection apparatus comprising:
a charged particle source;
a charged particle beam optical system which irradiates a sample with a charged particle beam emitted from the charged particle source;
a detector which detects secondary electrons emitted from the sample; and
probes which are brought into contact with the sample, and from which signals are obtained to form an image; wherein:
a sample image is formed based on a current flowing through the probes or a voltage generated between the probes due to irradiation with the charged particle beam;
the sample image is obtained at each of a plurality of different sample temperatures; and
a new image is formed by addition or subtraction of signals of the plurality of sample images.

2. A sample inspection apparatus according to claim 1, wherein the new image is formed by addition or subtraction of signals of images obtained by adding weights to a part or the whole of the plurality of sample images obtained at the different temperatures.

3. A sample inspection apparatus according to claim 1, wherein the plurality of sample images are aligned and/or corrected in magnification before the sample images are used to form the new image.

4. A sample inspection apparatus comprising:
a charged particle source;
a charged particle beam optical system which irradiates a sample with a charged particle beam emitted from the charged particle source;
a detector which detects secondary electrons emitted from the sample; and
probes which are brought into contact with the sample, and from which signals are obtained to form an image; wherein:
a sample image is formed based on a current flowing through the probes or a voltage generated between the probes due to irradiation with the charged particle beam;
the sample image is obtained in each of a plurality of different conditions of the charged particle optical system; and
a new image is formed by addition or subtraction of signals of the plurality of sample images.

5. A sample inspection apparatus according to claim 4, wherein the different conditions of the charged particle optical system are changed by changing an acceleration voltage, a charged particle beam dose or a charged particle beam incident angle of the charged particle source for irradiating the sample.

6. A sample inspection apparatus according to claim 4, wherein the new image is formed by addition or subtraction of signals of images obtained by adding weights to a part or the whole of the plurality of sample images.

7. A sample inspection apparatus according to claim 4, wherein the plurality of sample images are aligned and/or corrected in magnification before the sample images are used to form the new image.

8. A sample inspection apparatus comprising:
a charged particle source;
a charged particle beam optical system which irradiates a sample with a charged particle beam emitted from the charged particle source;
a detector which detects secondary electrons emitted from the sample; and
probes which are brought into contact with the sample, and from which signals are obtained to form an image; wherein:
a sample image is formed based on a current flowing through the probes or a voltage generated between the probes due to irradiation with the charged particle beam;
the sample image is obtained in each of a plurality of different positions of each probe; and
a new image is formed by addition or subtraction of signals of the plurality of sample images.

9. A sample inspection apparatus according to claim 8, wherein each probe is brought into contact with different positions on a wire of the sample so as to obtain the sample images.

10. A sample inspection apparatus according to claim 8, wherein the new image is formed by addition or subtraction of signals of images obtained by adding weights to a part or the whole of the plurality of sample images.

11. A sample inspection apparatus according to claim 8, wherein the plurality of sample images are aligned and/or corrected in magnification before the sample images are used to form the new image.

12. A sample inspection apparatus comprising:
a charged particle source;
a charged particle beam optical system which irradiates a sample with a charged particle beam emitted from the charged particle source;
a detector which detects secondary electrons emitted from the sample; and
probes which are brought into contact with the sample, and from which signals are obtained to form an image; wherein:
a sample image is formed based on a current flowing through the probes or a voltage generated between the probes due to irradiation with the charged particle beam;
the sample image is obtained in each of a plurality of different positions in a depth direction of the sample, where the charged particle beam is focused; and
the plurality of sample images are superimposed on one another in the depth direction of the sample, and a signal amount is interpolated among the sample images, so as to form a new image having a plane perpendicular to the sample images.

13. A sample inspection apparatus according to claim 12, wherein the different positions of the charged particle optical system are changed by changing an acceleration voltage, a charged particle beam dose or a charged particle beam incident angle of the charged particle source for irradiating the sample.

14. A sample inspection apparatus according to claim 12, wherein the new image is formed by addition or subtraction of signals of images obtained by adding weights to a part or the whole of the plurality of sample images.

15. A sample inspection apparatus according to claim 12, wherein the plurality of sample images are aligned and/or corrected in magnification before the sample images are used to form the new image.

16. A sample inspection apparatus comprising:
a charged particle source;
a charged particle beam optical system which irradiates a sample with a charged particle beam emitted from the charged particle source;
a detector which detects secondary electrons emitted from the sample;
probes which are brought into contact with the sample, and from which signals are obtained to form an image; and
a charge detector which detects a charge amount of the sample; wherein:
the charge detector detects potential of the sample when one of the probes is to be moved; and
potential of the probe is approximated to the potential of the sample.

17. A sample inspection apparatus according to claim 16, wherein after the potential of the probe is approximated to the potential of the sample, the probe is brought into contact with the sample, and the potential of the probe is further changed.

* * * * *